(12) United States Patent
Lee et al.

(10) Patent No.: US 11,094,869 B2
(45) Date of Patent: Aug. 17, 2021

(54) TRANSPARENT LIGHT EMITTING DEVICE DISPLAY

(71) Applicant: LG CHEM, LTD., Seoul (KR)

(72) Inventors: Kun Seok Lee, Daejeon (KR); Yong Goo Son, Daejeon (KR); Bumwoo Lee, Daejeon (KR); Seung Heon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 7 days.

(21) Appl. No.: 16/758,565

(22) PCT Filed: Nov. 13, 2018

(86) PCT No.: PCT/KR2018/013836
§ 371 (c)(1),
(2) Date: Apr. 23, 2020

(87) PCT Pub. No.: WO2019/139241
PCT Pub. Date: Jul. 18, 2019

(65) Prior Publication Data
US 2020/0350475 A1 Nov. 5, 2020

(30) Foreign Application Priority Data
Jan. 15, 2018 (KR) .................. 10-2018-0005015

(51) Int. Cl.
*H01L 33/62* (2010.01)
*H01L 25/075* (2006.01)

(52) U.S. Cl.
CPC .......... *H01L 33/62* (2013.01); *H01L 25/0753* (2013.01); *H01L 2933/0066* (2013.01)

(58) Field of Classification Search
CPC combination set(s) only.
See application file for complete search history.

(56) References Cited

U.S. PATENT DOCUMENTS

| 2014/0291008 A1 | 10/2014 | Huang |
| 2015/0060120 A1 | 3/2015 | Park |
| 2015/0062449 A1 | 3/2015 | Park |
| 2015/0077361 A1 | 3/2015 | Seo et al. |
| 2015/0212244 A1 | 7/2015 | Kim et al. |
| 2015/0378481 A1* | 12/2015 | Cok ...................... G06F 3/0443 345/173 |

(Continued)

FOREIGN PATENT DOCUMENTS

JP H10256602 9/1998
KR 10-20150026876 3/2015

(Continued)

*Primary Examiner* — Ratisha Mehta
(74) *Attorney, Agent, or Firm* — Dentons US LLP

(57) ABSTRACT

A transparent light emitting device display, comprising a transparent substrate, at least two light emitting devices provided on the transparent substrate, a first common electrode wiring portion, a second common electrode wiring portion, and a signal electrode wiring portion provided on the transparent substrate, electrode pad portions provided between each of the transparent substrates and the light emitting devices, and an electrode pad connection portion electrically connecting the first common electrode wiring portion, the second common electrode wiring portion, and the signal electrode wiring portion to the electrode pad portion.

19 Claims, 9 Drawing Sheets

(56) References Cited

U.S. PATENT DOCUMENTS

| | | | |
|---|---|---|---|
| 2016/0099385 A1 | 4/2016 | Kim et al. | |
| 2016/0245491 A1 | 8/2016 | Kim | |
| 2016/0282973 A1 | 9/2016 | Kholodenko et al. | |
| 2018/0049318 A1 | 2/2018 | Maki | |
| 2018/0157357 A1* | 6/2018 | Lin | H01L 27/1251 |

FOREIGN PATENT DOCUMENTS

| | | |
|---|---|---|
| KR | 10-20150031917 | 3/2015 |
| KR | 10-1512236 | 4/2015 |
| KR | 10-1580213 | 12/2015 |
| KR | 10-20160103818 | 9/2016 |
| KR | 10-1689131 | 12/2016 |
| KR | 10-1789145 | 10/2017 |
| WO | 2016-178322 | 11/2016 |

* cited by examiner

[Figure 1]
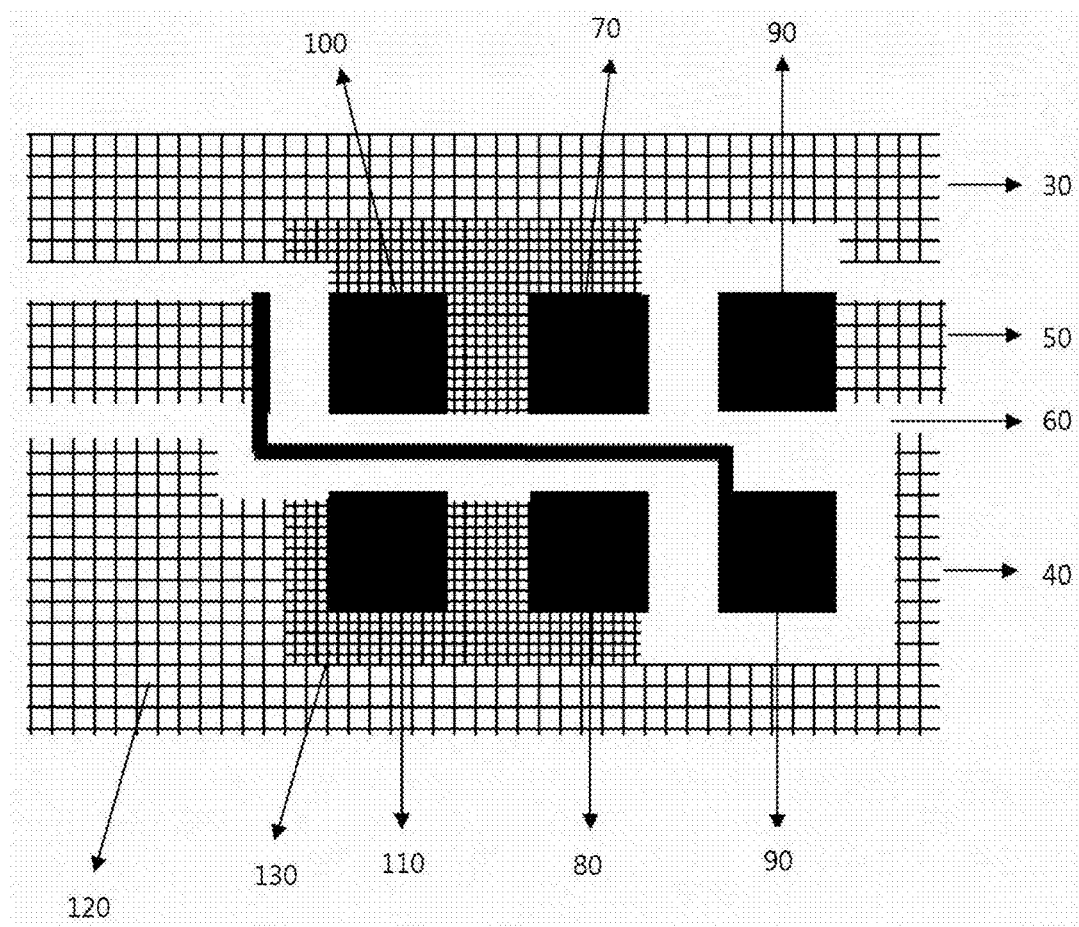

[Figure 2]
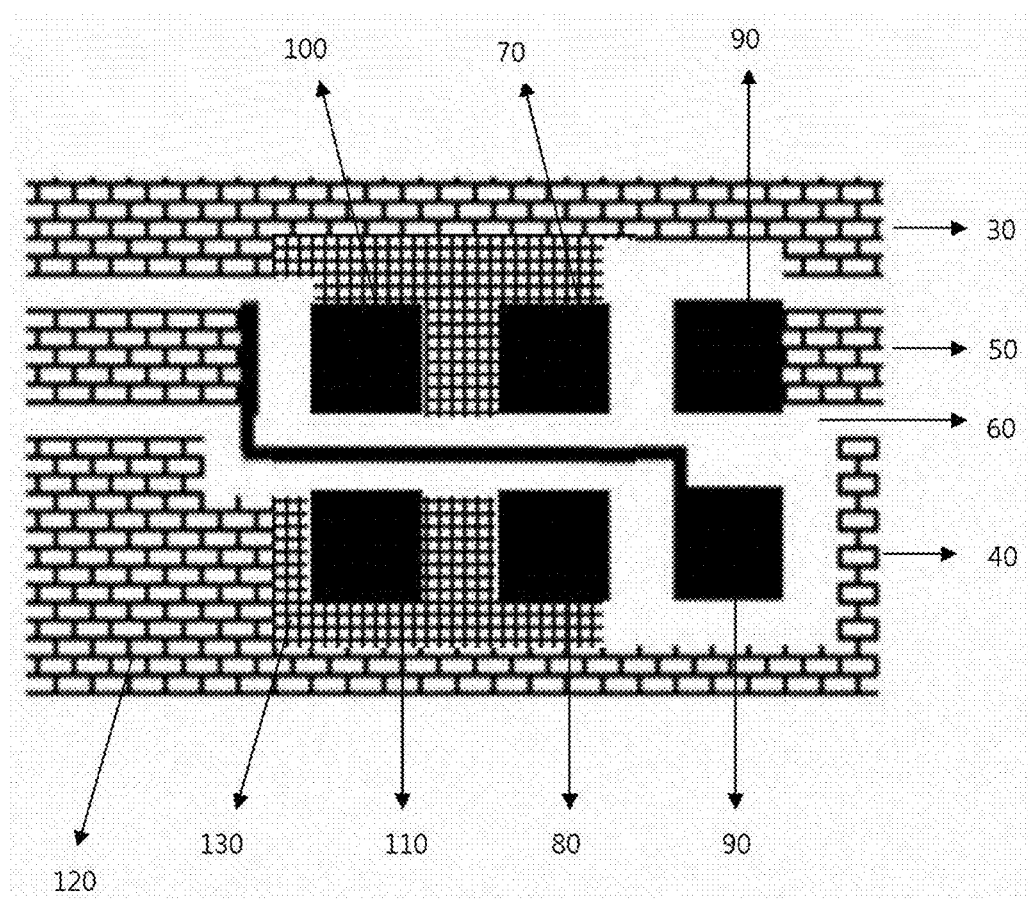

[Figure 3]
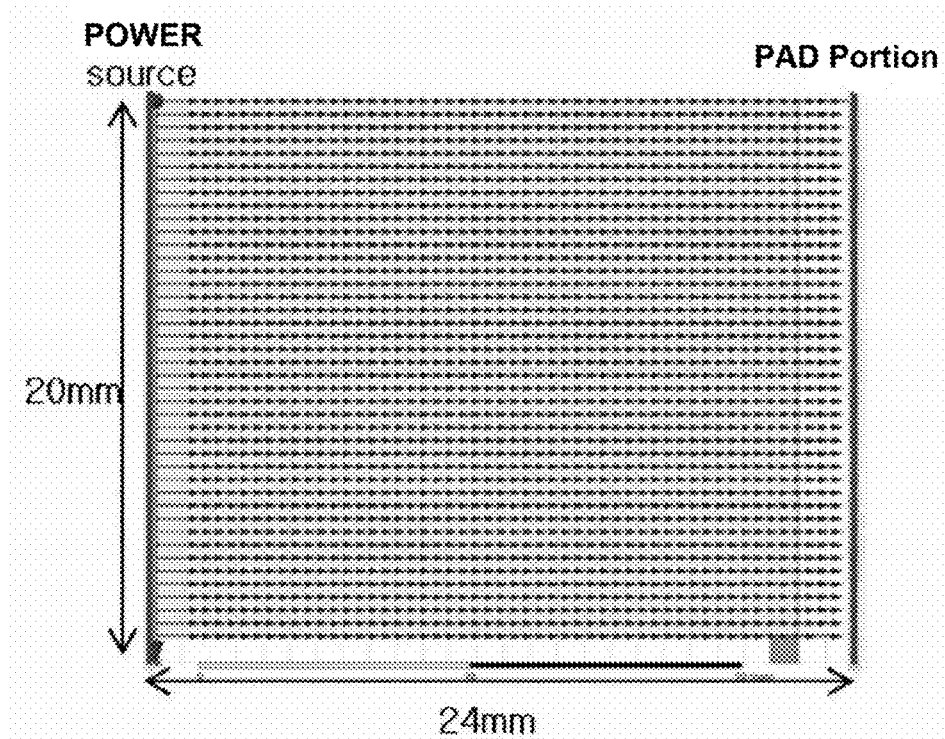
[Figure 4]
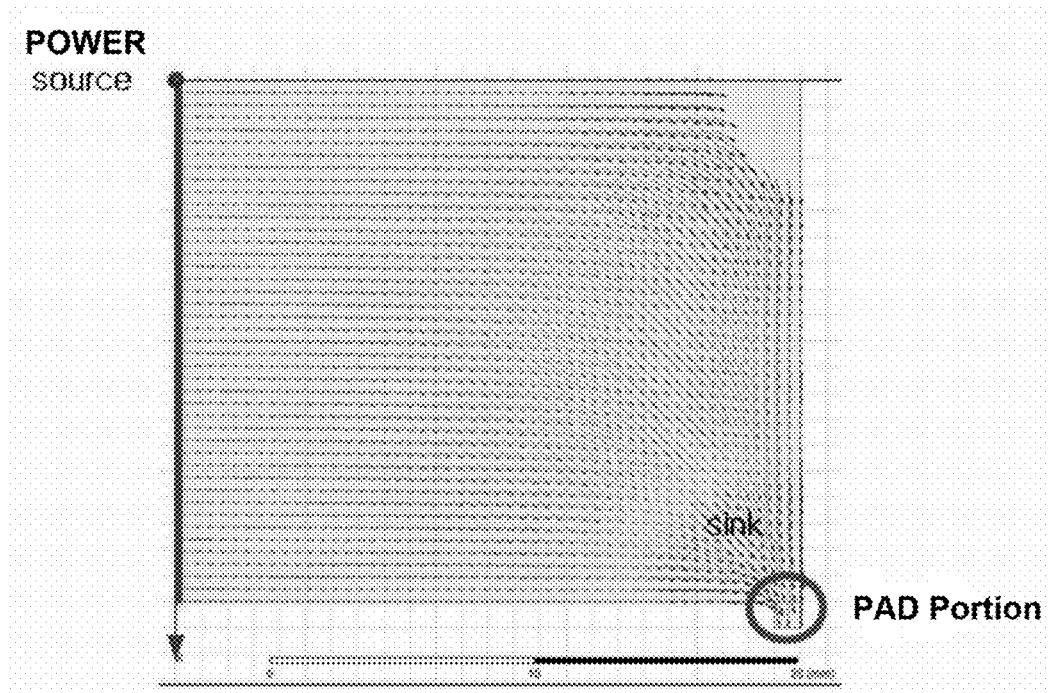

[Figure 5]
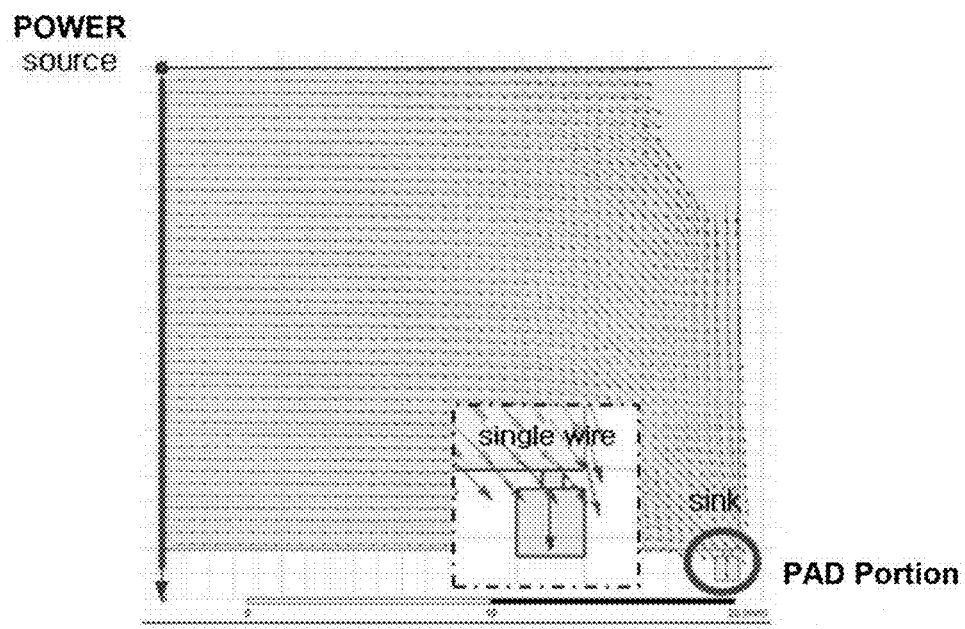
[Figure 6]
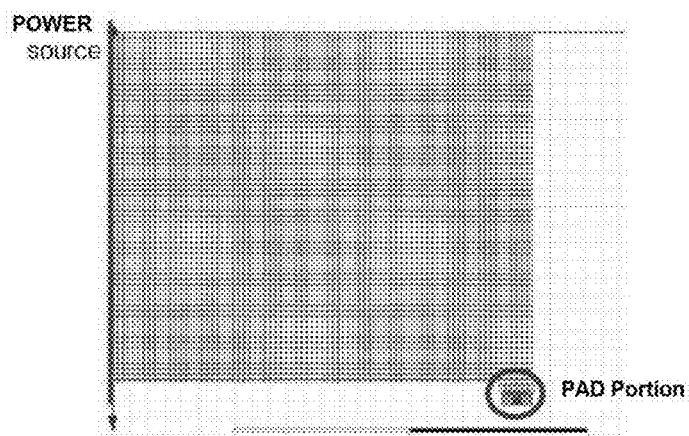
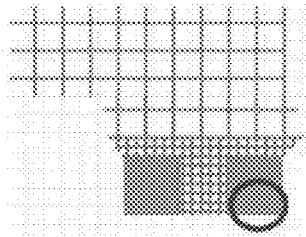
<Experimental Example 4>
<Experimental Example 5>
<Experimental Example 6>
Measurement Pad Portion

[Figure 7]
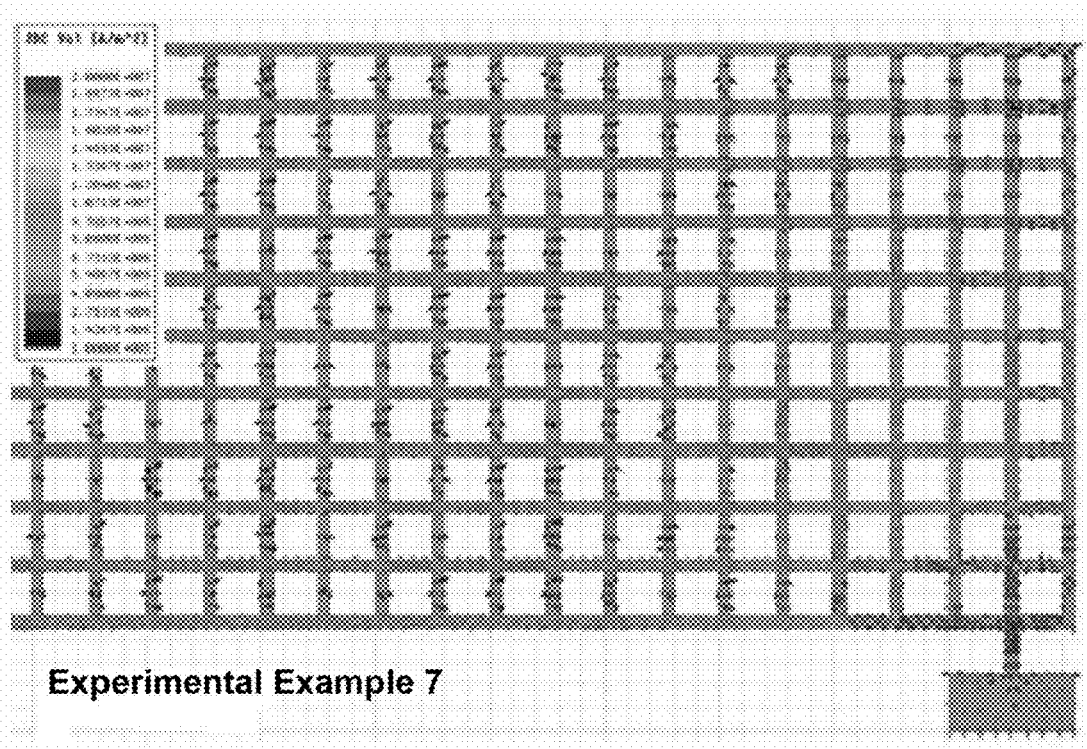
Experimental Example 7
[Figure 8]
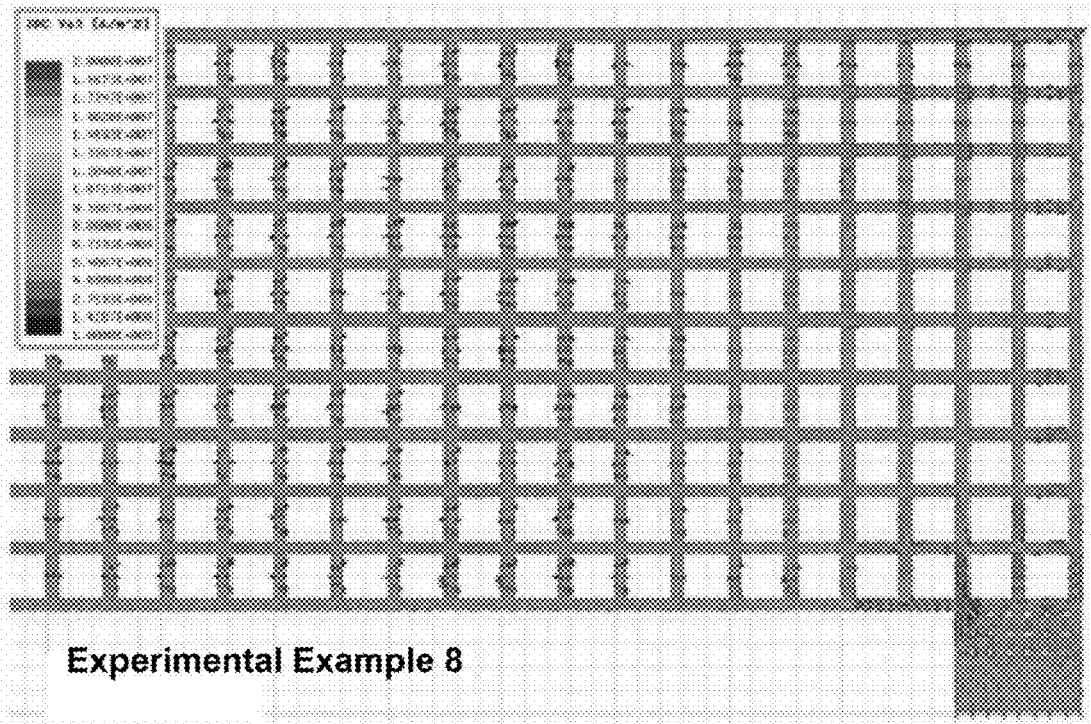
Experimental Example 8

[Figure 9]
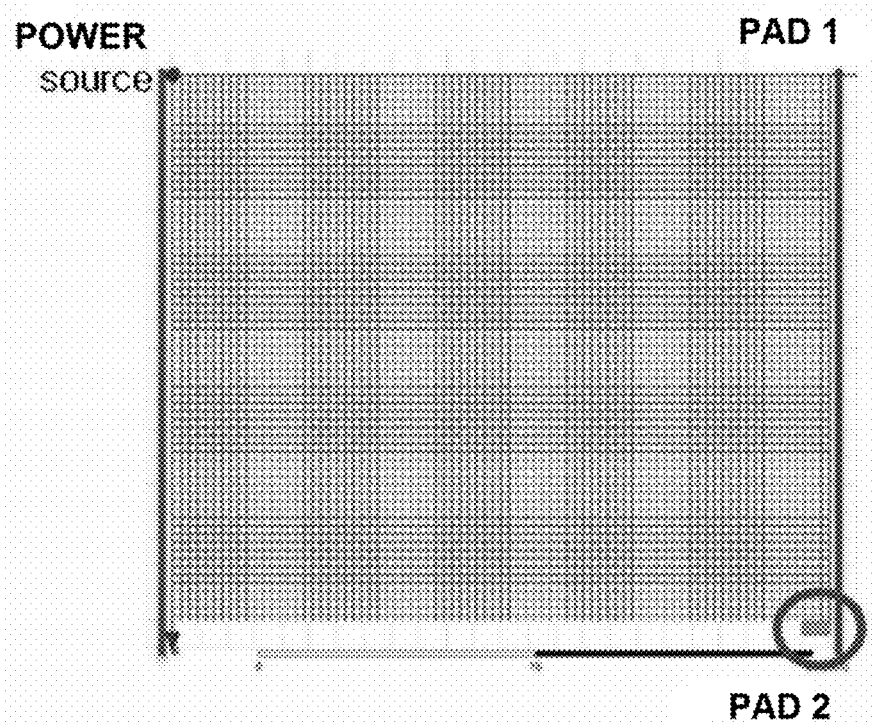
[Figure 10]
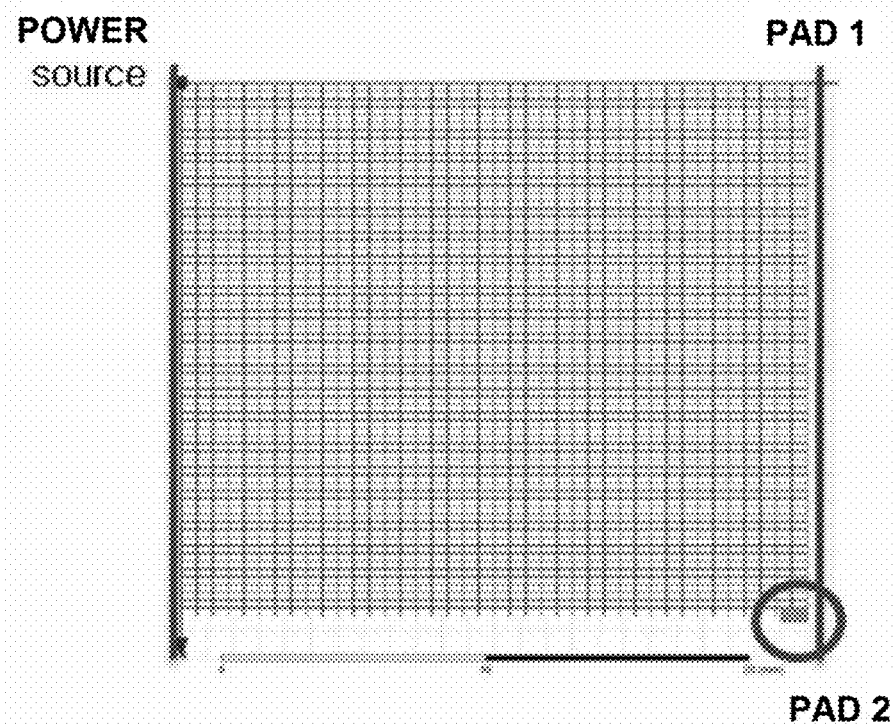

[Figure 11]
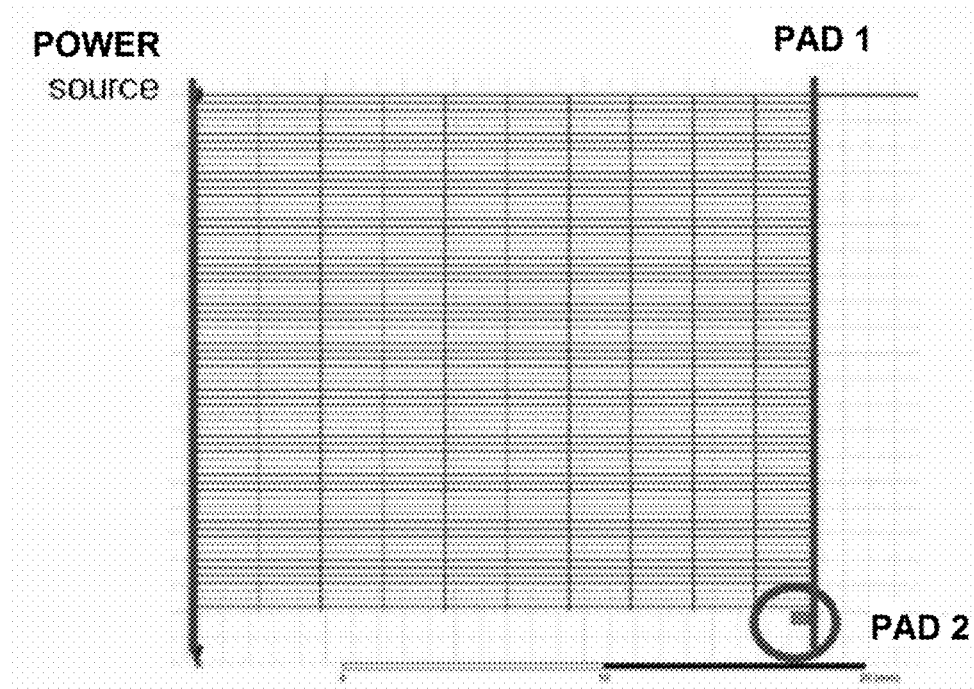

[Figure 12]
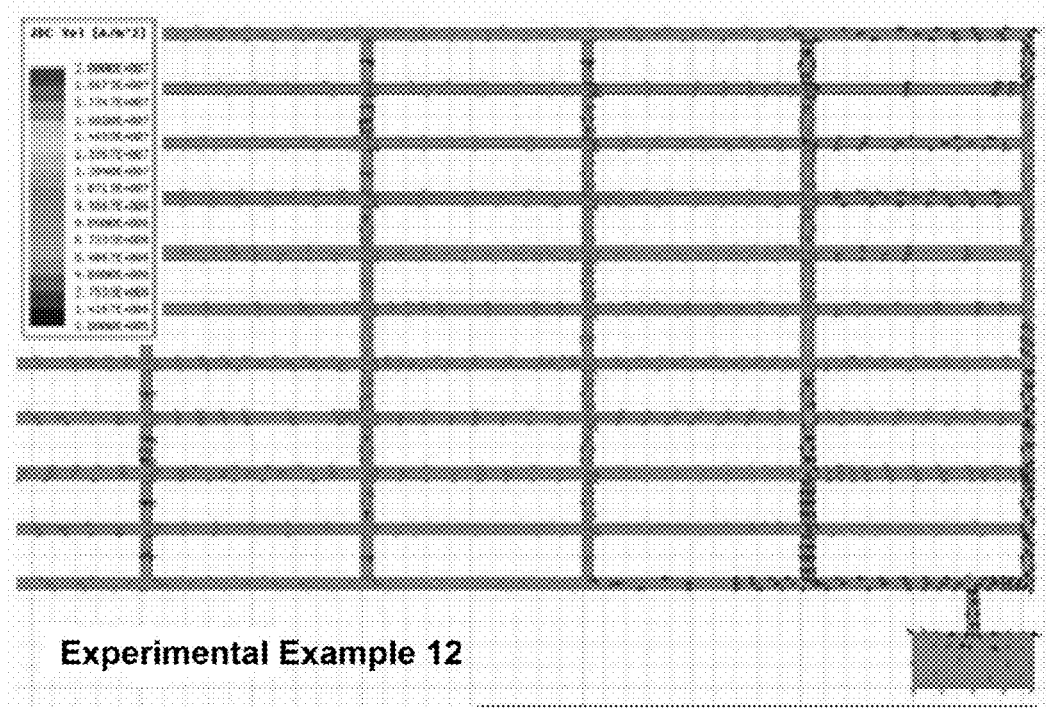
Experimental Example 12
[Figure 13]
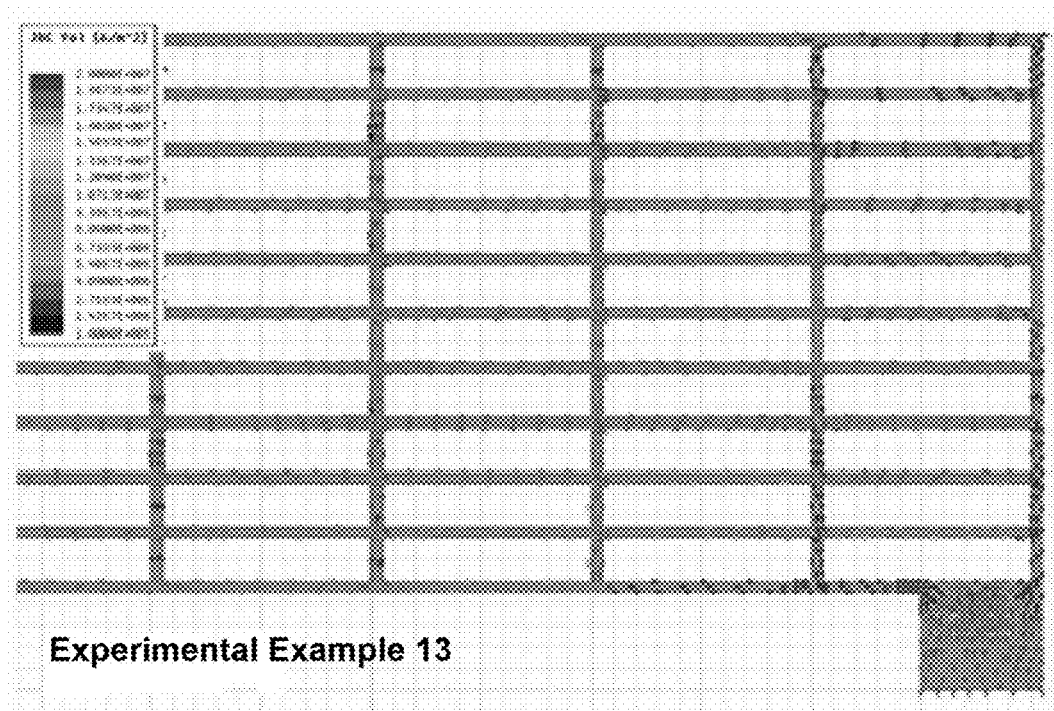
Experimental Example 13

[Figure 14]
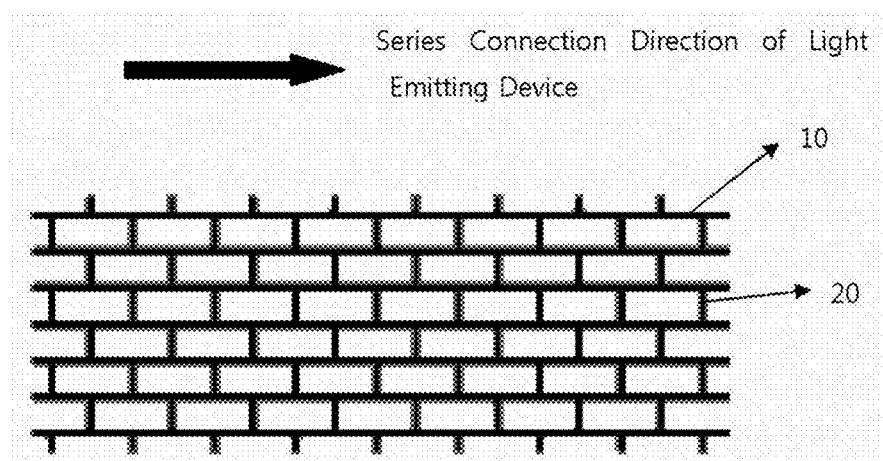
[Figure 15]
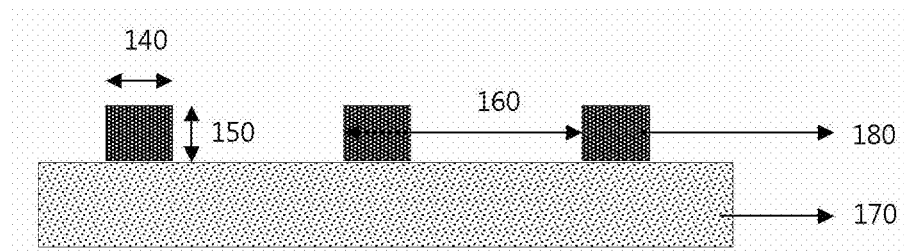

TRANSPARENT LIGHT EMITTING DEVICE DISPLAY

TECHNICAL FIELD

This application claims priority to and the benefit of Korean Patent Application No. 10-2018-0005015 filed in the Korean Intellectual Property Office on Jan. 15, 2018, the entire contents of which are incorporated herein by reference.

The present application relates to a transparent light emitting device display.

BACKGROUND ART

Recently, Korea has been providing information and things to see to urban people by creating various landscape lighting in parks and urban areas as well as colorful signboards through a fusion of advanced ICT technology and LED technology. In particular, a transparent LED display using a transparent electrode material has an LED applied between a glass and a glass, and there is an advantage that an aesthetic display is possible since a wire is not seen. Therefore, the transparent LED display is being used for interior decoration of hotels, department stores, and the like, and importance of the transparent LED display is increasing in an implementation of a media facade on an exterior wall of a building.

A transparent electrode which is transparent and through which electricity flows and thus is used for a touch screen has explosively increased in demand due to a spread of a smart device. The most widely used transparent electrode is indium tin oxide (ITO) which is an oxide of indium and tin. However, indium, which is a main material of an ITO transparent electrode material, is not reserved in a large amount all over the world, is produced only in some countries such as China, and production cost is high. In addition, since a resistance value is high and is not constantly applied, LED light to be displayed has a disadvantage in that the transparent LED using ITO may not exhibit a desired luminance and is not constant. Therefore, the transparent LED using ITO has a limit to be utilized as a high-performance and low-cost transparent electrode material.

It is a fact that ITO is the most widely used as the transparent electrode material, however, due to limitations of economical efficiency, limited performance, and the like, research and technology development using a new material are continuously being conducted. A transparent electrode material that is attracting attention as a next generation new material comprises metal meshes, nanowire (Ag nanowire), carbon nanotube (CNT), conductive polymer, graphene, and the like. Among them, a metal mesh is a new material which occupies 85% of the material substituting ITO, has low cost and high conductivity. A market is expanding in terms of utilization of metal mesh.

A transparent LED display using metal mesh has conductivity much better than that of a transparent display of the related art, is easy to maintain, can greatly reduce resource saving, prevention of environmental pollution, and is economical due to reduction of manufacturing cost. In addition, since an expansion application for various uses is possible, the transparent LED display using metal mesh can be applied to and utilized for various products as a new transparent electrode material.

DISCLOSURE

Technical Problem

The present application is to provide a transparent light emitting device display using a metal mesh pattern.

Technical Solution

According to an embodiment of the present application, a transparent light emitting device display comprises a transparent substrate, at least two light emitting devices provided on the transparent substrate, a first common electrode wiring portion, a second common electrode wiring portion, and a signal electrode wiring portion provided on the transparent substrate, electrode pad portions provided between each of the transparent substrates and the light emitting devices, and an electrode pad connection portion electrically connecting the first common electrode wiring portion, the second common electrode wiring portion, and the signal electrode wiring portion to the electrode pad portion.

The first common electrode wiring portion, the second common electrode wiring portion, and the signal electrode wiring portion comprise a first metal mesh pattern, and the first metal mesh pattern is provided in a region having an area of 80% or more of a total area of the transparent substrate.

At least a portion region of the electrode pad connection portion comprises a second metal mesh pattern.

At least two light emitting devices are connected to the signal electrode wiring portion in series.

The first metal mesh pattern and the second metal mesh pattern independently comprise a parallel wiring parallel to a direction of the series connection and a vertical wiring perpendicular to the parallel wiring.

A ratio of a closure rate of the second metal mesh pattern per unit area expressed by the following Equation 2 to a closure rate of the first metal mesh pattern per unit area expressed by the following Equation 1 is 1.5 to 10.

closure rate (%) of first metal mesh pattern per unit area=$[(P2 \times W1 + P1 \times W2 - W1 \times W2)/(P1 \times P2)] \times 100$    [Equation 1]

closure rate (%) of second metal mesh pattern per unit area=$[(P4 \times W3 + P3 \times W4 - W3 \times W4)/(P3 \times P4)] \times 100$    [Equation 2]

In the above Equations 1 and 2,

W1 is a line width of the vertical wiring of the first metal mesh pattern, P1 is a pitch of the vertical wiring of the first metal mesh pattern, W2 is a line width of the parallel wiring of the first metal mesh pattern, and P2 is a pitch of the parallel wiring of the first metal mesh pattern.

W3 is a line width of the vertical wiring of the second metal mesh pattern, P3 is a pitch of the vertical wiring of the second metal mesh pattern, W4 is a line width of the parallel wiring of the second metal mesh pattern, and P4 is a pitch of the parallel wiring of the second metal mesh pattern.

Advantageous Effects

According to an embodiment of the present application, the metal mesh pattern of which the closure rate is higher than that of a metal mesh pattern of the electrode wiring portion is introduced to the electrode pad connecting portion connecting the first common electrode wiring portion, the second common electrode wiring portion, and the signal electrode wiring portion to the electrode pad portion, and thus it is possible to prevent an increase in resistance of the electrode.

According to an embodiment of the present application, the metal mesh pattern of which the line width, the pitch, and the like of the vertical wiring and the parallel wiring are adjusted is applied to the first common electrode wiring portion, the second common electrode wiring portion, and the signal electrode wiring portion, thereby reducing recognition of the wiring. In addition, the metal mesh pattern is provided in the entire region of an effective screen portion of a top surface of the transparent substrate excluding a region where the light emitting device is provided, thereby reducing the resistance by maximizing the area of the common electrode wiring portion.

In addition, according to an embodiment of the present application, the width of the disconnection portion separating the metal mesh patterns of the first common electrode wiring portion, the second common electrode wiring portion, and the signal electrode wiring portion is minimized, thereby reducing recognition of the wiring.

In addition, according to an embodiment of the present application, there is a characteristic that it is possible to increase an aperture ratio of the metal mesh pattern without reducing the resistance by reducing the closure rate of the vertical wiring perpendicular to a current direction.

In addition, according to an embodiment of the present application, a light emitting device pad portion is provided with a limited area at edges of the first common electrode wiring portion and the second common electrode wiring portion. In this case, as an example for reducing the closure rate of the vertical wiring, in a case where the pitch of the vertical wiring is increased, the mesh pattern may not be connected to the light emitting device pad portion, and thus an electrical short circuit may occur. It is possible to prevent the electrical short circuit by applying a connection portion of the second metal mesh pattern separately from the first metal mesh pattern as a robust design for preventing the electrical short circuit.

DESCRIPTION OF DRAWINGS

FIGS. 1 and 2 are diagrams schematically illustrating an electrode wiring of a transparent light emitting device display according to an embodiment of the present application.

FIG. 3 is a diagram schematically illustrating a resistance simulation result of an electrode of a transparent light emitting device display of Experimental Example 1 of the present application.

FIG. 4 is a diagram schematically illustrating a resistance simulation result of an electrode of a transparent light emitting device display of Experimental Example 2 of the present application.

FIG. 5 is a diagram schematically illustrating a resistance simulation result of an electrode of a transparent light emitting device display of Experimental Example 3 of the present application.

FIG. 6 is a diagram schematically illustrating a resistance simulation result of an electrode of a transparent light emitting device display of Experimental Examples 4 to 6 of the present application.

FIG. 7 is a diagram schematically illustrating a resistance simulation result of an electrode of a transparent light emitting device display of Experimental Example 7 of the present application.

FIG. 8 is a diagram schematically illustrating a resistance simulation result of an electrode of a transparent light emitting device display of Experimental Example 8 of the present application.

FIG. 9 is a diagram schematically illustrating a resistance simulation result of an electrode of a transparent light emitting device display of Experimental Example 9 of the present application.

FIG. 10 is a diagram schematically illustrating a resistance simulation result of an electrode of a transparent light emitting device display of Experimental Example 10 of the present application.

FIG. 11 is a diagram schematically illustrating a resistance simulation result of an electrode of a transparent light emitting device display of Experimental Example 11 of the present application.

FIG. 12 is a diagram schematically illustrating a resistance simulation result of an electrode of a transparent light emitting device display of Experimental Example 12 of the present application.

FIG. 13 is a diagram schematically illustrating a resistance simulation result of an electrode of a transparent light emitting device display of Experimental Example 13 of the present application.

FIG. 14 is a diagram schematically illustrating a parallel wiring and a vertical wiring of a metal mesh pattern of the present application.

FIG. 15 is a diagram schematically illustrating a line width, a line height, and a pitch of the metal mesh pattern according to an embodiment of the present application.

EXPLANATION OF REFERENCE NUMERALS AND SYMBOLS

10: parallel wiring
20: vertical wiring
30: first common electrode wiring portion
40: second common electrode wiring portion
50: signal electrode wiring portion
60: disconnection portion
70: first common electrode pad
80: second common electrode pad
90: signal electrode pad
100: first common electrode capacitor pad
110: second common electrode capacitor pad
120: first metal mesh pattern
130: second metal mesh pattern
140: line width of metal mesh pattern
150: line height of metal mesh pattern
160: pitch of metal mesh pattern
170: transparent substrate
180: metal mesh pattern

MODE FOR INVENTION

Hereinafter, the present application will be described in detail.

A transparent LED display provides various displays for urban people through information provision services and landscape creation, and demand is increasing in various fields. It is a fact that ITO is the most widely used as a transparent electrode material until not. However, due to limitations of economical efficiency, limited performance, and the like, research and technology development using a new material are continuously performed.

More specifically, in implementing a transparent LED display of the related art, an Ag nanowire or a transparent metal oxide (ITO, IZO, or the like) is introduced to form a transparent electrode wiring. However, since the Ag nanowire or the transparent metal oxides (ITO, IZO, etc.) has a high resistance, there is a limit to the number of LED driving. Therefore, there is a limit to increase a size of the transparent LED display to a large size. In addition, in a case where a thickness of the Ag nanowire or the transparent metal oxide is increased in order to reduce the resistance, there is a disadvantage that a transmittance of the transparent LED display is reduced.

Therefore, in the present application, in order to provide a transparent light emitting device display having excellent resistance characteristic, visibility, and the like, a metal mesh pattern is applied to a transparent electrode wiring of the transparent light emitting device display.

In the metal mesh pattern, in order to increase the transmittance, a method of increasing a line width of the metal mesh pattern or increasing a pitch of the metal mesh pattern can be used. However, in a case where the line width of the metal mesh pattern is increased or the pitch is increased, there is a disadvantage that the resistance can increase. Thus, in the present application, an opening ratio of the metal mesh pattern is to be increased without loss of resistance by reducing the closure rate of a wiring perpendicular to a current direction.

In addition, since an electrode pad electrically connecting a light emitting device and an electrode wiring is provided at a small size on an edge of the electrode wiring rather than the whole line width of the electrode wiring, a connection of a mesh line between the electrode wiring and the electrode pad is limited, and the resistance at the electrode pad is somewhat increased on a current flow. In particular, in a case where the closure rate of the wiring perpendicular to the current direction is reduced, the resistance at the electrode pad can be further increased rapidly, thereby increasing a channel resistance of each light emitting device and reducing a luminance of the light emitting device.

Therefore, in the present application, a metal mesh pattern of which a closure rate is higher than that of a metal mesh pattern of an electrode wiring is applied to a region where an electrode wiring is connected to an electrode pad, thereby preventing the resistance from increasing.

A transparent light emitting device display according to an embodiment of the present application comprises a transparent substrate, at least two light emitting devices provided on the transparent substrate, a first common electrode wiring portion, a second common electrode wiring portion, and a signal electrode wiring portion provided on the transparent substrate, electrode pad portions provided between each of the transparent substrates and the light emitting devices, and an electrode pad connection portion electrically connecting the first common electrode wiring portion, the second common electrode wiring portion, and the signal electrode wiring portion to the electrode pad portion. The first common electrode wiring portion, the second common electrode wiring portion, and the signal electrode wiring portion comprise a first metal mesh pattern, and the first metal mesh pattern is provided in a region having an area of 80% or more of a total area of the transparent substrate. At least a portion of the electrode pad connection portion comprises a second metal mesh pattern. At least two light emitting devices are connected to the signal electrode wiring portion in series. The first metal mesh pattern and the second metal mesh pattern independently comprise a parallel wiring parallel to a direction of the series connection and a vertical wiring perpendicular to the parallel wiring. A ratio of a closure rate of the second metal mesh pattern per unit area expressed by Equation 2 to a closure rate of the first metal mesh pattern per unit area expressed by Equation 1 is 1.5 to 10.

It is preferable that the ratio of the closure rate of the second metal mesh pattern per unit area expressed by Equation 2 to the closure rate of the first metal mesh pattern per unit area expressed by Equation 1 is 1.5 to 6, however, the present application is not limited thereto.

In the present application, the parallel wiring parallel to the series connection direction does not refer to only a wiring completely parallel to the series connection direction, however, can also comprise a case where a deviation thereof is within ±2°. In addition, the vertical wiring perpendicular to the parallel wiring does not refer to only a wiring completely perpendicular to the parallel wiring, however, can also comprise a case where the deviation thereof is within ±5°.

In an embodiment of the present application, each of the electrode pad portions can comprise two signal electrode pads, one first common electrode pad, one first common electrode capacitor pad, one second common electrode pad, and one second common electrode capacitor pad.

The two signal electrode pad portions can be respectively provided at ends of the signal electrode wiring portions, as signal in-out pad portions of the light emitting device, and the first common electrode pad portion and the second common electrode pad portion can be respectively provided at ends of the first common electrode wiring portion and the second common electrode wiring portion. The capacitor pad portion is a pad to which a capacitor is attached, and the capacitor can perform a role of stabilizing a current supplied to the light emitting device.

The first common electrode pad portion, the second common electrode pad portion, the signal electrode pad portion, and the capacitor pad portion may not comprise the metal mesh pattern, and the entire region of each pad portion can comprise metal. More specifically, since the first common electrode pad portion, the second common electrode pad portion, and the signal electrode pad portion are covered by the light emitting device to be welded, the first common electrode pad portion, the second common electrode pad portion, and the signal electrode pad portion may not comprise the metal mesh pattern, and the entire region of each pad portion can comprise metal.

A distance between adjacent pads among the signal electrode pad, the first common electrode pad, the first common electrode capacitor pad, the second common electrode pad, and the second common electrode capacitor pad is 0.1 mm to 1 mm. It is possible to prevent a short in consideration of a tolerance in screen printing of a solder paste for forming a light emitting device at a later time by having the above-described distance.

A shape of the signal electrode pad, the first common electrode pad, the first common electrode capacitor pad, the second common electrode pad, and the second common electrode capacitor pad is not particularly limited and can be a rectangular shape. In addition, sizes of the signal electrode pad, the first common electrode pad, the first common electrode capacitor pad, the second common electrode pad, and the second common electrode capacitor pad are independently 0.1 mm$^2$ to 1 mm$^2$, however, are not limited thereto.

The two signal electrode pads, the one common electrode pad, and the one second common electrode pad can be bonded to one light emitting device. That is, in one embodiment of the present application, in a case where a plurality of light emitting devices are provided on a transparent substrate, each of the light emitting devices can be bonded to the two signal electrode pads, the one common electrode pad, and the one second common electrode pad. In addition, each of the first common electrode capacitor pad and the second common electrode capacitor pad can be bonded to one capacitor.

In an embodiment of the present application, the electrode pad connection portion can comprise a first electrode pad connection portion that electrically connects the first common electrode wiring portion to the first common electrode pad and the first common electrode capacitor pad, and the first electrode pad connection portion can comprise the second metal mesh pattern. At this time, an area of a region where the second metal mesh pattern is provided is 1.5 to 3 times areas of each of the first common electrode pad and the first common electrode capacitor pad, however, is not limited thereto.

In addition, the electrode pad connection portion can comprise a second electrode pad connection portion that electrically connects the second common electrode wiring portion to the second common electrode pad and the second common electrode capacitor pad, and the second electrode pad connection portion can comprise the second metal mesh pattern. At this time, the area of the region where the second metal mesh pattern is provided is 1.5 to 3 times areas of each of the second common electrode pad and the second common electrode capacitor pad, however, is not limited thereto. It is possible to minimize the area of the connection portion by having the above-described area ratio, and thus it is possible to minimize the recognition of the wiring.

In an embodiment of the present application, the area of the region where the second metal mesh pattern is provided can be equal to or less than three times a total area of the two signal electrode pads, the one first common electrode pad, the one first common electrode capacitor pad, the one second common electrode pad, and the one second common electrode capacitor pad, however, is not limited thereto.

In an embodiment of the present application, a ratio of a closure rate of the parallel wiring per unit area of the first metal mesh pattern expressed by the following Equation 4 to a closure rate of the vertical wiring per unit area of the first metal mesh pattern expressed by the following Equation 3 is 1 to 10. In addition, a ratio of a closure rate of the parallel wiring per unit area of the second metal mesh pattern expressed by the following Equation 6 to a closure rate of the vertical wiring per unit area of the second metal mesh pattern expressed by the following Equation 5 is 0.1 to 1.

closure rate (%) of vertical wiring per unit area of first metal mesh pattern=$(W1/P1) \times 100$  [Equation 3]

closure rate (%) of parallel wiring per unit area of first metal mesh pattern=$(W2/P2) \times 100$  [Equation 4]

closure rate (%) of vertical wiring per unit area of second metal mesh pattern=$(W3/P3) \times 100$  [Equation 5]

closure rate (%) of parallel wiring per unit area of second metal mesh pattern=$(W4/P4) \times 100$  [Equation 6]

In Equations 3 to 6, definitions of W1, W2, W3, W4, P1, P2, P3, and P4 are the same as in Equations 1 and 2.

According to an embodiment of the present application, since only the parallel wiring parallel to the series connection direction is involved in the resistance, it is possible to increase an opening ratio without loss of the resistance of the metal mesh pattern.

In a case where the ratio of the closure rate of the parallel wiring per unit area of the first metal mesh pattern expressed by Equation 4 to the closure rate of the vertical wiring per unit area of the first metal mesh pattern expressed by Equation 3 is less than 1, an effect of improving the transmittance or improving the resistance can be slight. In addition, in a case where the ratio of the closure rate of the parallel wiring per unit area of the first metal mesh pattern expressed by Equation 4 to the closure rate of the vertical wiring per unit area of the first metal mesh pattern expressed by Equation 3 is greater than 10, a short circuit vulnerability can be increased or a pattern may not be implemented, and a problem that the pattern is visually recognized can occur.

It is preferable that the ratio of the closure rate of the parallel wiring per unit area of the first metal mesh pattern expressed by Equation 4 to the closure rate of the vertical wiring per unit area of the first metal mesh pattern expressed by Equation 3 is 1 to 6, however, is not limited thereto.

In the present application, a line width of the parallel wiring of the first metal mesh pattern can be greater than or equal to a line width of the vertical wiring of the first metal mesh pattern. In addition, a line width of the vertical wiring of the second metal mesh pattern can be greater than or equal to a line width of the parallel wiring of the second metal mesh pattern.

In addition, the closure rate of the first metal mesh pattern per unit area expressed by Equation 1 can be 5% to 30%.

In a case where the closure rate of the first metal mesh pattern per unit area expressed by Equation 1 is less than 5%, a problem that an LED may not be driven can occur, and in a case where the closure rate of the first metal mesh pattern per unit area expressed by Equation 1 is greater than 30%, a problem that the transmittance is reduced and a role of a transparent electrode may not be performed can occur.

It is preferable that the closure rate of the first metal mesh pattern expressed by Equation 1 is 5% to 20%, however, is not limited thereto.

In the present application, two or more light emitting devices can be provided on an upper surface of the transparent substrate, and the two or more light emitting devices can be connected to the signal electrode wiring in series. The number of the light emitting devices can be appropriately selected by those skilled in the art in consideration of a use or the like of the transparent light emitting device display, and is not particularly limited. More specifically, the number of the light emitting devices is related to the resistance of the electrode, and the number of the light emitting devices can be increased as the electrode is sufficiently low to resistance and an area of the display is larger. In a case where the number of light emitting devices is increased in the same area, a resolution is increased. In a case where the number of light emitting devices is increased at the same interval, since the area of the display is increased and thus a wire line of a power supplying unit can be reduced, the number of the light emitting devices can be appropriately selected by those skilled in the art in consideration of a use or the like of the transparent light emitting device display.

In an embodiment of the present application, the two or more light emitting devices can be connected to the signal electrode wiring portion in series, and can be connected to the first common electrode wiring portion and the second common electrode wiring portion in parallel. Since the first common electrode wiring portion and the second common electrode wiring portion provide a sufficient amount of current for driving the light emitting device and a color signal of the light emitting device can be transmitted by only a low current, the first common electrode wiring portion and the second common electrode wiring portion can be connected to the signal electrode wiring portion in series. In a case where the light emitting devices are connected to each electrode of the power supply unit in parallel rather than the structure of the present application for driving and signaling all the light emitting devices, widths of each of the electrodes are required to be different from each other in order to match the resistance value according to a disposition distance of the light emitting device (the width of the electrode connected to the farthest light emitting device is the largest), and it is difficult to configure the electrode with low resistance due to a spatial limitation of an electrode disposition region because of a characteristic in which a plurality of light emitting devices are provided.

In the present application, the signal electrode wiring portion can be provided between the first common electrode wiring portion and the second common electrode wiring portion.

In the present application, the first common electrode wiring portion can be a (+) common electrode wiring portion, and the second common electrode wiring portion can be a (−) common electrode wiring portion. In addition, the first common electrode wiring portion can be a (−) common electrode wiring portion, and the second common electrode wiring portion can be a (+) common electrode wiring portion.

The electrode wiring of the transparent light emitting device display according to an embodiment of the present application is schematically illustrated in FIG. 1.

According to the present application, a channel is formed in a structure in which the signal electrode wiring portion passes between the (+) common electrode wiring portion and the (−) common electrode wiring portion. Therefore, the electrode wiring is not separately provided for each light emitting device and can be connected to the (+) common electrode wiring portion and the (−) common electrode wiring portion as a common electrode.

According to an embodiment of the present application, the first common electrode wiring portion, the second common electrode wiring portion, and the signal electrode wiring portion comprise the first metal mesh pattern, and the first metal mesh pattern can be provided in the entire region of an effective screen portion of a top surface of the transparent substrate excluding a region where the light emitting device is provided. More specifically, the first metal mesh pattern can be provided in a region having an area of 80% or more of a total area of the transparent substrate, and can be provided in an area of 99.5% or less. In addition, the first metal mesh pattern can be provided in a region having an area of 80% or more of an area excluding an FPCB pad portion region and a light emitting device pad portion region provided on the transparent substrate, based on the total area of the transparent substrate, and can be provided in an area of 99.5% or less. In the present application, the FPCB pad portion region can comprise an FPCB pad portion for applying an external power source, and an area of the FPCB pad portion region can be equal to or greater than a total area of the FPCB and can be equal to or less than three times the total area of the FPCB pad portion region. In addition, in the present application, the light emitting device pad portion region comprises the above-described electrode pad portion, and an area of the light emitting device pad portion region can be equal to or greater than 1.5 times a total area of the electrode pad portion and can be equal to or less than three times the total area of the electrode pad portion.

In an embodiment of the present application, in the first metal mesh pattern and the second metal mesh pattern, a pattern shape of the art can be used. More specifically, the metal mesh pattern can comprise a rectangular pattern.

Since the first metal mesh pattern is provided in the entire region of the effective screen portion of the upper surface of the transparent substrate excluding the region where the light emitting device is provided, a maximum permissible wiring region can be ensured, thereby improving a resistance characteristic of the transparent light emitting device display. More specifically, a surface resistance of the first metal mesh pattern is 0.1 Ω/sq or less.

Pitches of each of the first metal mesh pattern and the second metal mesh pattern independently can be 100 μm to 1,000 μm, can be 100 μm to 600 μm, can be 100 μm to 300 μm, and the pitches can be controlled by those skilled in the art according to a desired transmittance and conductivity.

Materials of the first metal mesh pattern and the second metal mesh pattern are not particularly limited, but preferably comprise at least one of metal and metal alloy. The metal mesh pattern can comprise, gold, silver, aluminum, copper, neodymium, molybdenum, nickel, or an alloy thereof, however, is not limited thereto.

Line heights of the first metal mesh pattern and the second metal mesh pattern are not particularly limited, however, can be 1 μm or more, can be 20 μm or less, and can be 10 μm or less in terms of conductivity and economical efficiency of a formation process of the metal mesh pattern. More specifically, the line heights of the first metal mesh pattern and the second metal mesh pattern can be 1 μm to 20 μm, and can be 1 μm to 10 μm.

Line widths of the first metal mesh pattern and the second metal mesh pattern can be 50 μm or less and can be 40 μm or less, however, are not limited thereto. It is advantageous in terms of the transmittance and the recognition of the wiring as the line width of the metal mesh pattern is less, however, the resistance can be reduced. At this time, in a case where the line height of the metal mesh pattern is increased, the resistance reduction can be enhanced. The line width of the metal mesh pattern can be 5 μm or more.

An opening ratio of the first metal mesh pattern, that is, an area ratio that is not covered by the pattern can be 70% or more, can be 85% or more, and can be 95% or more.

In an embodiment of the present application, the opening ratio of the first metal mesh pattern can refer to a ratio of an area that is not covered by the first metal mesh pattern based on an upper portion area of the transparent substrate, and the closure rate of the first metal mesh pattern can refer to a ratio of an area that is covered by the first metal mesh pattern based on the upper portion area of the transparent substrate.

In the present application, the first metal mesh patterns of each of the first common electrode wiring portion, the second common electrode wiring portion, and the signal electrode wiring portion can be separated from each other by a disconnection portion where the first metal mesh pattern is not provided. The disconnection portion refers to a region where a part of the first metal mesh pattern is disconnected and electrical connection is disconnected from each other. A width of the disconnection portion can refer to a distance between the closest adjacent ends between the first common electrode wiring portion, the second common electrode wiring portion, and the signal electrode wiring portion that are spaced apart from each other. The width of the disconnection portion can be 80 μm or less, can be 60 μm or less, can be 40 μm or less, and can be 30 μm or less, however, is not limited thereto. The width of the disconnection portion can be 5 μm or more.

According to an embodiment of the present application, the width of the disconnection portion for separating the first metal mesh patterns of the first common electrode wiring portion, the second common electrode wiring portion, and the signal electrode wiring portion is minimized, thereby reducing the recognition of the wiring.

In addition, the line width 140, the line height 150, and the pitch 160 of the metal mesh pattern according to an embodiment of the present application are schematically illustrated in FIG. 15. The line width, the line height, and the pitch of the metal mesh pattern can be measured using methods known in the art. For example, a method of measuring the line width, the line height, and the pitch of the metal mesh pattern by observing an SEM cross section, a method of measuring the line width, the line height, and the pitch of the metal mesh pattern by a non-contact surface shape measuring device (optical profiler), a method of measuring the line width, the line height, and the pitch of the metal mesh pattern by a stylus type surface step measuring device (alpha step or surface profiler), and the like can be used.

In the present application, each of the first metal mesh pattern and the second metal mesh pattern can be formed by an independent printing process or can be simultaneously formed by a single printing process. Therefore, the first metal mesh pattern and the second metal mesh pattern can have the same line height. In the present application, the same line height means that a standard deviation of the line height is 10% or less, preferably 5% or less, or more preferably 2% or less.

In the present application, in order to form the first metal mesh pattern and the second metal mesh pattern, the first metal mesh pattern of the first common electrode wiring portion, the second common electrode wiring portion, and the signal electrode wiring portion, and the second metal mesh pattern of the electrode pad portion connection portion of which line widths are thin and minute can be formed on the transparent substrate by using printing method. The printing method is not particularly limited, and printing methods such as offset printing, screen printing, gravure printing, flexographic printing, inkjet printing, and nano-imprinting can be used, and a combination of one or more of them can be used. The printing method can use a roll to roll method, a roll to plate method, a plate to roll method, or a plate to plate method.

In the present application, it is preferable that a reverse offset printing method is applied to realize a precise metal mesh pattern. To this end, in the present application, a method in which an ink capable of serving as a resist at a time of etching is coated on the entire surface of a silicone based rubber referred to as a blanket, an unnecessary portion is removed through an intaglio on which a pattern referred to as a first cliché is imprinted, a printing pattern remaining on a blanket is secondly transferred to a substrate such as a film or a glass on which a metal or the like is deposited, and then firing and etching processes are performed to form a desired pattern can be performed. In a case where such a method is used, a uniformity of the line height is ensured in all regions by using the metal deposited substrate. Therefore, there is an advantage that the resistance in a thickness direction can be uniformly maintained. In addition, the present application can comprise a direct printing method of forming a desired pattern by directly printing and then firing a conductive ink using the above-described reverse offset printing method. At this time, the line height of the pattern is flattened by pressing pressure, and an application of conductivity can be given by a thermo-firing process, a microwave firing process/laser part firing process, or the like for connection by mutual surface fusion of metal nanoparticles.

In the present application, a glass substrate or a plastic substrate known in the art can be used for the transparent substrate, and the transparent substrate is not particularly limited.

In the present application, the light emitting device provided on the upper surface of the transparent substrate can be formed using a material and a method known in the art.

Hereinafter, the embodiment described herein will be illustrated by way of Examples.

However, it is not intended that the scope of the embodiment is limited by the following Examples.

EXAMPLES

Experimental Examples 1 to 3

Resistance simulation was performed with an electrode width of 20 mm and an electrode length of 24 mm as a basic unit. In an applied metal mesh pattern, the ratio of the closure rate of the vertical wiring to the closure rate of the parallel wiring was 1, the line width was the same as 20 the line height was 8 and the pitch was 300 μm. A general square metal mesh pattern was applied to examine an influence of a pad position and a connection type.

Experimental Example 1 illustrates a case where the pad is the same as the width of the common electrode wiring portion, and is schematically illustrated in FIG. 3 below. In addition, Experimental Example 2 illustrates a case where the pad is positioned at the edge of the common electrode wiring portion and the entire pad is connected to the common electrode wiring portion, and is schematically illustrated in FIG. 4 below. In addition, Experimental Example 3 illustrates a case where the pad is positioned at the edge of the common electrode wiring portion and the pad is connected to the common electrode wiring portion through a single wire, and is schematically illustrated in FIG. 5 below.

Vectors of FIGS. 3 to 5 illustrate current vectors, and magnitudes of the currents are determined only by colors since scales between Experiment examples 1 to 3 are different. Resistance values between a power source and the pads are illustrated in Table 1 below.

TABLE 1

| | Experimental Example 1 | Experimental Example 2 | Experimental Example 3 |
|---|---|---|---|
| Resistance value between power source and pad | 0.051 Ω | 0.11 Ω | 0.155 Ω |

Experimental Example 1 has the lowest resistance, however, is limited to an LED size and a disposition position due to an electrode structure. Therefore, the pad is positioned at the edge of the common electrode, and thus an application is impossible.

In the cases of Experimental Example 2 and Experimental Example 3, at an initial stage of a current flow, the current vector has a vertical direction component only in a direction parallel to the current direction by an asymmetric geometry as the current advances near the pad. In addition, in Experimental Example 3, addition of a resistance of the single wire occurs and thus the resistance is increased as compared with Experimental Example 2.

Experimental Examples 4 to 6

The resistance simulation was performed with the electrode width of 20 mm and the electrode length of 24 mm as the basic unit. In the applied metal mesh pattern, the ratio of the closure rate of the vertical wiring to the closure rate of the parallel wiring was 1, the line width was the same as 20 the line height was 8 and the pitch was 300 µm.

In Experimental Example 4 as an embodiment of the present application, a metal mesh pattern having a high closure rate was applied to the electrode pad connection portion, and twelve mesh lines were connected to each pad. The line width of the metal mesh pattern applied to the electrode pad connection portion was 20 µm the line height was 8 µm, and the pitch was 100 µm.

In addition, in Experimental Example 5 and Experimental Example 6, four mesh lines and one mesh line were connected to electrode pad connection portions, respectively. This is schematically illustrated in FIG. 6.

The resistance values between the power source and the pads are illustrated in Table 2 below.

TABLE 2

|  | Experimental Example 4 | Experimental Example 5 | Experimental Example 6 |
|---|---|---|---|
| The number of meshes connected to measurement pad | 12 | 4 | 1 |
| Resistance value between power source and pad | 0.114 Ω | 0.124 Ω | 0.159 Ω |

As a result described above, as a mesh line connected to the pad at the edge of the common electrode is reduced, the resistance increases.

As a result of Experimental Examples 1 to 3, the pad positioned at the edge of the electrode caused an extreme resistance increase when the pad was a single wire. Therefore, as a result of the applications of the number of vertical wirings connected to the pad to 12, 4, and 1, in order to prevent the resistance increase, as the number of the vertical wirings increases, the resistance is reduced. In case of applying 1, extreme resistance increase is caused as in Experimental Example 3. However, in a case of applying the connection portion to increase to 12, a resistance level similar to that of Experimental Example 2 can be secured.

Experimental Examples 7 and 8

The resistance simulation was performed with the electrode width of 3 mm and the electrode length of 72 mm as the basic unit. In the applied metal mesh pattern, the ratio of the closure rate of the vertical wiring to the closure rate of the parallel wiring was 1, the line width was the same as 20 µm the line height was 8 µm, and the pitch was 300 µm.

An electrode having a square of which a ratio of width:length of a unit mesh is 1:1, and an electrode having a single wire connected between a main electrode and the electrode pad were applied to Experimental Example 7. A length of the single wire that is the electrode pad connecting portion of Experimental Example 7 is 300 µm. In addition, an electrode having a square of which a ratio of width:length of a unit mesh is 1:1, and an electrode formed of a mesh having a tight connection between the main electrode and the electrode pad were applied to Experimental Example 8. A metal mesh pattern of the electrode pad connection portion of Experimental Example 8 has the line width of 20 µm, the line height of 8 µm, and the pitch of 100 µm, and is a square pattern.

Resistance simulation results of the electrodes of Experimental Examples 7 and 8 are schematically illustrated in FIGS. 7 and 8 below, and the resistance values between the power source and the pad are illustrated in Table 3 below.

TABLE 3

|  | Experimental Example 7 | Experimental Example 8 |
|---|---|---|
| Resistance value between power source and pad | 1.02 Ω | 0.97 Ω |

Experimental Examples 7 and 8 are results of simulating the resistance of the last LED pad portion using a long electrode in a longitudinal direction as a model since dozens of LEDs are arranged in an actual product.

As a result described above, the resistance value is reduced by 0.05Ω in Experimental Example 8 to which the pad connection portion was applied in comparison with Experimental Example 7. Such a resistance difference indicates a value similar to 0.045Ω that is a resistance difference between Experimental Example 4 to which the pad connection portion is applied and Experimental Example 6 to which the single wire is applied. As a result, the application of the pad connection portion has the same effect of reducing a resistance of the LED pad portion in an actual electrode length modeling.

Experimental Examples 9 to 11

The resistance simulation was performed with the electrode width of 20 mm and the electrode length of 24 mm as the basic unit. In the applied metal mesh pattern, the line width was the same as 20 µm, and the line height was 8 µm.

In Experimental Example 9, the pitch of the parallel wiring was 300 µm and the pitch of the vertical wiring was 300 µm to cause (pitch of parallel wiring:pitch of vertical wiring) to be 1:1, and is schematically illustrated in FIG. 9 below. In addition, in Experimental Example 10, the pitch of the parallel wiring was 300 µm and the pitch of the vertical wiring was 600 µm to cause (pitch of parallel wiring:pitch of vertical wiring) to be 1:2, and is schematically illustrated in FIG. 10 below. In addition, in Experimental Example 11, the pitch of the parallel wiring was 300 µm and the pitch of the vertical wiring was 2,400 µm to cause (pitch of parallel wiring:pitch of vertical wiring) to be 1:8, and is schematically illustrated in FIG. 11 below.

The resistance values between the power source and the pads are illustrated in Table 4 below.

TABLE 4

|  | Experimental Example 9 | Experimental Example 10 | Experimental Example 11 |
|---|---|---|---|
| Pitch ratio (parallel wiring:vertical wiring) | 1:1 | 1:2 | 1:8 |
| Resistance value between power source and pad 1 | 0.048 Ω | 0.0494 Ω | 0.0512 Ω |
| Resistance value between power source and pad 2 | 0.118 Ω | 0.142 Ω | 0.284 Ω |

As a result of the resistance value of the pad 1, it can be determined that the parallel wiring, that is, a wiring parallel to the current advancing direction is mainly involved in the resistance since the resistance increase is small as the pitch of the vertical wiring increases. In addition, as a result of the resistance value of the pad 2, as the pitch of the vertical wiring increases, the vertical wiring is reduced around the pad, and thus the resistance rapidly increases.

Experimental Examples 12 and 13

The resistance simulation was performed with the electrode width of 3 mm and the electrode length of 72 mm as the basic unit. In the applied metal mesh pattern, the line width was the same as 20 μm, the line height was 8 μm, the pitch of the parallel wiring was 300 μm, and the pitch of the vertical wiring was 1,200 μm.

An electrode having a rectangle of which a ratio of width:length of a unit mesh is 1:4, and an electrode having a single wire connected between the main electrode and the electrode pad were applied to Experimental Example 12. A length of the single wire that is the electrode pad connecting portion of Experimental Example 12 is 300 μm. In addition, an electrode having a rectangle of which a ratio of width:length of a unit mesh is 1:4, and an electrode formed of a mesh having a tight connection between the main electrode and the electrode pad was applied to Experimental Example 13. A metal mesh pattern of the electrode pad connection portion of Experimental Example 13 has the line width of 20 μm, the line height of 8 μm, and the pitch of 100 μm, and is a square pattern.

Resistance simulation results of the electrodes of Experimental Examples 12 and 13 are schematically illustrated in FIGS. 12 and 13 below, and the resistance values between the power source and the pad are illustrated in Table 5 below.

TABLE 5

|  | Experimental Example 12 | Experimental Example 13 |
|---|---|---|
| Resistance value between power source and pad | 1.12 Ω | 1.06 Ω |

Experimental Examples 12 and 13 are results of simulating the resistance of the last LED pad portion using a long electrode in a longitudinal direction as a model since dozens of LEDs are arranged in an actual product.

As a result described above, the resistance value is reduced by 0.06Ω in Experimental Example 13 to which the pad connection portion was applied in comparison with Experimental Example 12. Such a resistance difference is similar to the difference of Experimental Examples 7 and 8, and even though the closure rate of the vertical wiring of the main electrode portion is reduced, a resistance reduction effect of the pad connection portion independently acts and reduces the resistance.

Therefore, according to an embodiment of the present application, the metal mesh pattern of which the closure rate is higher than that of the metal mesh pattern of the electrode wiring portion is introduced to the electrode pad connecting portion that connects the first common electrode wiring portion, the second common electrode wiring portion, and the signal electrode wiring portion to the electrode pad portion, thereby preventing the resistance increase of the electrode.

In addition, according to an embodiment of the present application, the light emitting device pad portion is provided with a limited area at the edges of the first common electrode wiring portion and the second common electrode wiring portion. In this case, as an example for reducing the closure rate of the vertical wiring, in a case where the pitch of the vertical wiring is increased, the mesh pattern may not be connected to the light emitting device pad portion, and thus an electrical short circuit may occur. It is possible to prevent the electrical short circuit by applying a connection portion of the second metal mesh pattern separately from the first metal mesh pattern as a robust design for preventing the electrical short circuit.

The invention claimed is:
1. A transparent light emitting device display comprising:
a transparent substrate;
at least two light emitting devices provided on the transparent substrate;
a first common electrode wiring portion, a second common electrode wiring portion, and a signal electrode wiring portion provided on the transparent substrate;
electrode pad portions provided between each of the transparent substrates and the light emitting devices; and
an electrode pad connection portion electrically connecting the first common electrode wiring portion, the second common electrode wiring portion, and the signal electrode wiring portion to the electrode pad portion,
wherein the first common electrode wiring portion, the second common electrode wiring portion, and the signal electrode wiring portion comprise a first metal mesh pattern, and the first metal mesh pattern is provided in a region having an area of 80% or more of a total area of the transparent substrate,
at least a portion of the electrode pad connection portion comprises a second metal mesh pattern,
at least two light emitting devices are connected to the signal electrode wiring portion in series,
the first metal mesh pattern and the second metal mesh pattern independently comprise a parallel wiring parallel to a direction of the series connection and a vertical wiring perpendicular to the parallel wiring, and
a ratio of a closure rate of the second metal mesh pattern per unit area expressed by the following Equation 2 to a closure rate of the first metal mesh pattern per unit area expressed by the following Equation 1 is 1.5 to 10:

closure rate (%) of first metal mesh pattern per unit area=$[(P2 \times W1+P1 \times W2-W1 \times W2)/(P1 \times P2)] \times 100$  [Equation 1]

closure rate (%) of second metal mesh pattern per unit area=$[(P4 \times W3+P3 \times W4-W3 \times W4)/(P3 \times P4)] \times 100$  [Equation 2]

wherein in the above Equations 1 and 2:
W1 is a line width of the vertical wiring of the first metal mesh pattern;
P1 is a pitch of the vertical wiring of the first metal mesh pattern;
W2 is a line width of the parallel wiring of the first metal mesh pattern;
P2 is a pitch of the parallel wiring of the first metal mesh pattern;
W3 is a line width of the vertical wiring of the second metal mesh pattern;
P3 is a pitch of the vertical wiring of the second metal mesh pattern;
W4 is a line width of the parallel wiring of the second metal mesh pattern; and
P4 is a pitch of the parallel wiring of the second metal mesh pattern.
2. The transparent light emitting device display according to claim 1, wherein the ratio of the closure rate of the second metal mesh pattern per unit area expressed by Equation 2 to the closure rate of the first metal mesh pattern per unit area expressed by Equation 1 is 1.5 to 6.

3. The transparent light emitting device display according to claim 1, wherein each of the electrode pad portions comprises two signal electrode pads, one first common electrode pad, one first common electrode capacitor pad, one second common electrode pad, and one second common electrode capacitor pad.

4. The transparent light emitting device display according to claim 3, wherein the electrode pad connection portion comprises a first electrode pad connection portion that electrically connects the first common electrode wiring portion to the first common electrode pad and the first common electrode capacitor pad, and the first electrode pad connection portion comprises the second metal mesh pattern.

5. The transparent light emitting device display according to claim 4, wherein an area of a region where the second metal mesh pattern is provided is 1.5 to 3 times areas of each of the first common electrode pad and the first common electrode capacitor pad.

6. The transparent light emitting device display according to claim 3, wherein the electrode pad connection portion comprises a second electrode pad connection portion that electrically connects the second common electrode wiring portion to the second common electrode pad and the second common electrode capacitor pad, and the second electrode pad connection portion comprises the second metal mesh pattern.

7. The transparent light emitting device display according to claim 6, wherein an area of a region where the second metal mesh pattern is provided is 1.5 to 3 times areas of each of the second common electrode pad and the second common electrode capacitor pad.

8. The transparent light emitting device display according to claim 3, wherein an area of a region where the second metal mesh pattern is provided is equal to or less than three times a total area of the two signal electrode pads, the one first common electrode pad, the one first common electrode capacitor pad, the one second common electrode pad, and the one second common electrode capacitor pad.

9. The transparent light emitting device display according to claim 1, wherein a ratio of a closure rate of the parallel wiring per unit area of the first metal mesh pattern expressed by the following Equation 4 to a closure rate of the vertical wiring per unit area of the first metal mesh pattern expressed by the following Equation 3 is 1 to 10:

closure rate (%) of vertical wiring per unit area of first metal mesh pattern=$(W1/P1) \times 100$ [Equation 3]

closure rate (%) of parallel wiring per unit area of first metal mesh pattern=$(W2/P2) \times 100$ [Equation 4]

wherein in the above Equations 3 and 4;
W1 is a line width of the vertical wiring of the first metal mesh pattern;
P1 is a pitch of the vertical wiring of the first metal mesh pattern;
W2 is a line width of the parallel wiring of the first metal mesh pattern; and
P2 is a pitch of the parallel wiring of the first metal mesh pattern.

10. The transparent light emitting device display according to claim 1, wherein a ratio of a closure rate of the parallel wiring per unit area of the second metal mesh pattern expressed by the following Equation 6 to a closure rate of the vertical wiring per unit area of the second metal mesh pattern expressed by the following Equation 5 is 0.1 to 1:

closure rate (%) of vertical wiring per unit area of second metal mesh pattern=$(W3/P3) \times 100$ [Equation 5]

closure rate (%) of parallel wiring per unit area of second metal mesh pattern=$(W4/P4) \times 100$ [Equation 6]

wherein in the above Equations 5 and 6:
W3 is a line width of the vertical wiring of the second metal mesh pattern;
P3 is a pitch of the vertical wiring of the second metal mesh pattern;
W4 is a line width of the parallel wiring of the second metal mesh pattern; and
P4 is a pitch of the parallel wiring of the second metal mesh pattern.

11. The transparent light emitting device display according to claim 9,
wherein the ratio of the closure rate of the parallel wiring per unit area of the first metal mesh pattern expressed by Equation 4 to the closure rate of the vertical wiring per unit area of the first metal mesh pattern expressed by Equation 3 is 1 to 6.

12. The transparent light emitting device display according to claim 9, wherein:
the line width of the parallel wiring of the first metal mesh pattern is greater than or equal to the line width of the vertical wiring of the first metal mesh pattern; and
the line width of the vertical wiring of the second metal mesh pattern is greater than or equal to the line width of the parallel wiring of the second metal mesh pattern.

13. The transparent light emitting device display according to claim 1, wherein the closure rate of the first metal mesh pattern expressed by Equation 1 is 5% to 30%.

14. The transparent light emitting device display according to claim 1, wherein the signal electrode wiring portion is provided between the first common electrode wiring portion and the second common electrode wiring portion.

15. The transparent light emitting device display according to claim 1, wherein each of the first metal mesh pattern and the second metal mesh pattern independently has a line width of 50 μm or less, a pitch of 100 μm to 1,000 μm, and a line height of 1 μm or more.

16. The transparent light emitting device display according to claim 1, wherein the first metal mesh patterns of each of the first common electrode wiring portion, the second common electrode wiring portion, and the signal electrode wiring portion are separated from each other by a disconnection portion where the first metal mesh pattern is not provided, and a width of the disconnection portion is 80 μm or less.

17. The transparent light emitting device display according to claim 3, wherein sizes of each of the signal electrode pad, the first common electrode pad, the first common electrode capacitor pad, the second common electrode pad, and the second common electrode capacitor pad are independently 0.1 mm$^2$ to 1 mm$^2$.

18. The transparent light emitting device display according to claim 3, wherein a distance between adjacent pads among the signal electrode pad, the first common electrode pad, the first common electrode capacitor pad, the second common electrode pad, and the second common electrode capacitor pad is 0.1 mm to 1 mm.

19. The transparent light emitting device display according to claim 1, wherein the first metal mesh pattern and the second metal mesh pattern comprise gold, silver, aluminum, copper, neodymium, molybdenum, nickel, or an alloy thereof.

* * * * *